United States Patent [19]

Yamada

[11] Patent Number: 5,616,177
[45] Date of Patent: Apr. 1, 1997

[54] GROUP II-VI SEMICONDUCTOR LASER AND METHOD FOR THE MANUFACTURE THEREOF

[75] Inventor: Norihide Yamada, Kokubunji, Japan

[73] Assignee: Hewlett-Packard Company, Palo Alto, Calif.

[21] Appl. No.: 394,664

[22] Filed: Feb. 22, 1995

[30] Foreign Application Priority Data

Feb. 23, 1994 [JP] Japan .................................. 6-49762

[51] Int. Cl.$^6$ .................................................. C30B 25/14
[52] U.S. Cl. ........................ 117/102; 117/103; 117/108; 438/47
[58] Field of Search ...................... 437/129, 127; 148/DIG. 64; 117/108, 103, 102

[56] References Cited

U.S. PATENT DOCUMENTS

| 5,068,204 | 11/1991 | Kukimoto | 437/127 |
| 5,299,217 | 3/1994 | Migita et al. | 372/45 |
| 5,351,255 | 9/1994 | Schetzina | 437/129 |
| 5,366,927 | 11/1994 | Schetzina | 437/129 |

FOREIGN PATENT DOCUMENTS

| 0403110 | 12/1990 | European Pat. Off. | C30B 23/02 |
| 0568177A2 | 11/1993 | European Pat. Off. | C30B 23/02 |
| 0574947A1 | 12/1993 | European Pat. Off. | H01S 3/025 |

OTHER PUBLICATIONS

N. Nakayama, S. Itoh, T. Ohata, K, Nakano, H. Okuyama, M. Ozawa, A. Ishibashi, M. Ikeda, and Y. Mori, "Room Temperature Continuous Operation of Blue–Green Laser Diodes", Electronic Letters, vol. 29, No. 16, 5th Aug., 1993.

Bhargava, R. N., "Compact Blue Lasers in the Near Future", Journal of Crystal Growth, vol. 117, No. 1/4, Feb. 1992, pp. 894–901.

Kobayashi, Masakazu, et al., "The MBE Growth of Widegap II–VI Injections Lasers and LEDs", Optoelectronics Devices and Technologies, vol. 7, No. 1, Jun. 1992, pp. 1–10.

Ichino, Kunio, et al., "Metalorganic Molecular Beam Epitaxy of $Zn_{1-x}Cd_xS_ySe_{1-y}$ Quaternary Alloys on GaAs Substrate", Japanese Journal of Applied Physics, vol. 30, No. (B, Sep., 1991, pp. L1624–L1626.

Tamargo, M.C. et al., "MBE Growth of the (Zn,Cd)(Se,Te) System for Wide–Bandgap Heterostructure Lasers", Semiconductor Science and Technology, vol. 6, No. 9A, Bristol, GB, pp. A8–A13.

Primary Examiner—Robert Kunemund

[57] ABSTRACT

In a Group II–VI semiconductor laser based on MgZnSSe, CdZnSSe, and MgCdZnSSe, adsorption layers containing crystal structure elements and doping impurities are successively grown as crystals on an n-type substrate, wherein the layers from the initial adsorption layer to the next-to-last p-type adsorption layer are formed using solid-source MBE, and the last p-type adsorption layer is formed using gas-source MBE or MOVPE; and wherein the last p-type adsorption layer is preferably grown under Group II rich conditions.

4 Claims, 2 Drawing Sheets

GROUP II-VI SEMICONDUCTOR LASER AND METHOD FOR THE MANUFACTURE THEREOF

BACKGROUND OF THE INVENTION

1. Technical Field

The invention relates to Group II-VI semiconductor lasers. In particular, the invention relates to a Group II-VI semiconductor laser based on MgZnSSe, CdZnSSe, and MgCdZnSSe having excellent characteristics, a low threshold voltage, and a low operating voltage, and to a method for manufacturing such a laser.

2. Description of the Prior Art

In recent years, solid-source Molecular-Beam Epitaxy (MBE), Metal-Organic Vapor-Phase Epitaxy (MOVPE), and gas-source MBE methods have been developed and used to form crystals when fabricating Group II-VI semiconductor lasers.

In a solid-source MBE apparatus, a substrate is attached to a holder mounted roughly in the middle of a chamber. A pump having a high pumping speed, such as an ion pump, is used to establish and maintain an ultrahigh vacuum within the chamber. The elements and dopants that are needed for crystal growth are then deposited on the substrate. The elements and dopants are emitted in the form of beams from respective cells, i.e. heating furnaces, and form successive, multiple layers on the substrate as a result of various physical and chemical processes. Closing and opening a shutter installed near the emission port of each cell makes it possible to facilitate the formation of super lattices and to control the layer thickness of a hetero-laser at the atomic level. The adsorption conditions under which the elements and dopants are deposited to form the multilayer structure on the substrate are determined by such factors as the substrate temperature, the surface condition of the substrate, and the type of element or dopant.

When crystals are grown by solid-source MBE, various compounds or mixed crystals can be formed without restriction in terms of substrate crystals, and the supply of the crystal structure elements or doping impurities can be accurately controlled.

In gas-source MBE, several of the solid sources used in solid-source MBE are replaced by gas sources. In both processes, crystal growth can be monitored by using, for example, various electron-beam diffracting devices, scanning electron microscopes, and analyzers.

The MOMBE method is a crystal growth method that uses metal-organic materials in an ultrahigh vacuum chamber, where solid sources or gas sources used in an MBE method are replaced with metal-organic materials. As a general rule, such metal-organic materials are also emitted in gas form or after they are liquefied or gasified. For this reason, gas-source MBE and MOMBE are collectively referred to herein as "gas-source MBE."

Gas-source MBE is similar to solid-source MBE in that it can yield multi-element mixed crystals and super lattices, but because gas-source MBE involves the incorporation of gas molecules or metal-organic molecules into the substance that is emitted, the cell structure and adsorption conditions, e.g. temperature and pressure inside the chamber, are somewhat different from those used in solid-source MBE.

MOVPE, mentioned above, reacts metal-organic materials at high temperatures, and thus allows epitaxial growth of several types of compounds and their mixed crystals.

Solid-source MBE can produce Group II-VI semiconductor lasers having a highly accurately controlled layer structure. This method, however, produces devices having high threshold voltages Vth (usually 15 to 30 volts), thus increasing the resistance between the device electrodes. This increase in resistance is attributed to the large Schottky barriers formed between the p-type cap layer and the electrodes. The result is excessive device power consumption, the generation of excessive heat which exacerbates the need for heat sink capacity, and the ensuing increase in device size and reduction in device life time.

While gas-source MBE can produce a device having a low threshold voltage Vth (usually 2.5 to 7 volts), gas-source MBE is disadvantageous in terms of crystal quality, and so has not yet been put to practical use.

Gas-source MBE and solid-source MBE resemble each other in that they both require an ultrahigh vacuum and have other similar features, such that the same apparatus can be used to practice both methods. When, however, a semiconductor laser is manufactured using gas-source MBE, the ambient gas or gas source remains in the chamber. This is one reason why the combined use of gas-source MBE and solid-source MBE has not yet been implemented in the fabrication of semiconductor lasers.

SUMMARY OF THE INVENTION

The invention overcomes the above described disadvantages of prior art semiconductor laser fabrication techniques and provides a Group II-VI semiconductor laser, and a method for the fabrication of a Group II-VI semiconductor laser, e.g. based on MgZnSSe, CdZnSSe, and MgCdZnSSe, in which the resistance of the Schottky barrier between the device cap layer and electrode is reduced, and in which there is no adverse effect on the laser characteristics. The invention provides a Group II-VI semiconductor laser having excellent characteristics, a low threshold voltage, and a low operating voltage. In the preferred embodiment of the invention, an n-type substrate is used and the cap layer is a p-type layer.

In a Group II-VI semiconductor laser fabricated in accordance with the invention, the adsorption layers containing crystal structure elements and doping impurities are successively formed as crystals on an no-type substrate. The layers from the initial adsorption layer to the next-to-last p-type adsorption layer are formed using solid-source MBE, and the last p-type adsorption layer is formed using gas-source MBE or MOVPE. In the preferred embodiment of the invention, the last p-type adsorption layer is formed under Group II rich conditions

DETAILED DESCRIPTION OF THE INVENTION

The invention overcomes known limitations in the prior art and provides a Group II-VI semiconductor laser, e.g. based on MgZnSSe, CdZnSSe, and MgCdZnSSe, in which the resistance of the Schottky barrier between the device cap layer and electrode is reduced, and in which there is no adverse effect on the laser characteristics. In the preferred embodiment of the invention, an n-type substrate is used and the cap layer is a p-type layer.

The invention combines solid-source MBE and gas-source MBE, thereby disproving the commonly accepted belief that these two methods are separate, incompatible manufacturing processes. Thus, the invention makes it possible to produce a Group II–VI semiconductor laser where:

(1) the shortcomings of lasers manufactured using solid-source MBE and the shortcomings of the lasers manufactured using gas-source MBE can be simultaneously overcome, while the advantages of both methods are realized; and (2) production efficiency can be improved by carrying out both these methods as a continuous process, and by adopting measures that ensure that the sources, i.e. the prescribed elements or compounds used in the preceding processes inside the chamber, do not adversely affect subsequent process steps.

Specifically, in the herein described method for manufacturing a Group II–VI semiconductor laser, adsorption layers containing crystal structure elements and doping impurities are successively formed by emission as crystals on an n-type substrate. The layers from the initial adsorption layer to the next-to-last p-type adsorption layer are formed using solid-source MBE, and the last p-type adsorption layer is formed using gas-source MBE.

In view of this, the aforementioned last p-type adsorption layer would preferably be formed under Group II rich conditions. In this embodiment of the invention, it is preferred that the II–VI beam dose ratio be maintained at from about 2:1 to about 8:1 during the formation of the last p-type adsorption layer.

In an alternative embodiment of the invention, MOVPE can be used instead of gas-source MBE when it is possible to avoid surface deterioration that may be caused by the oxidation of the crystal surface and other undesirable changes. However, it is usually difficult in such cases to perform both solid-source MBE and MOVPE in the same chamber.

A Group II–VI semiconductor laser manufactured in accordance with the invention can provide the threshold voltage Vth from about 2.5 to about 7 volts. The invention can be used to fabricate single hetero-lasers, double hetero-lasers, and many other types of stripe semiconductor lasers and surface emitting semiconductor lasers. While n-type GaAs substrates, n-type ZnSe substrates, and various other substrates can be used in the invention, n-type GaAs substrates are usually used.

Figure 1:
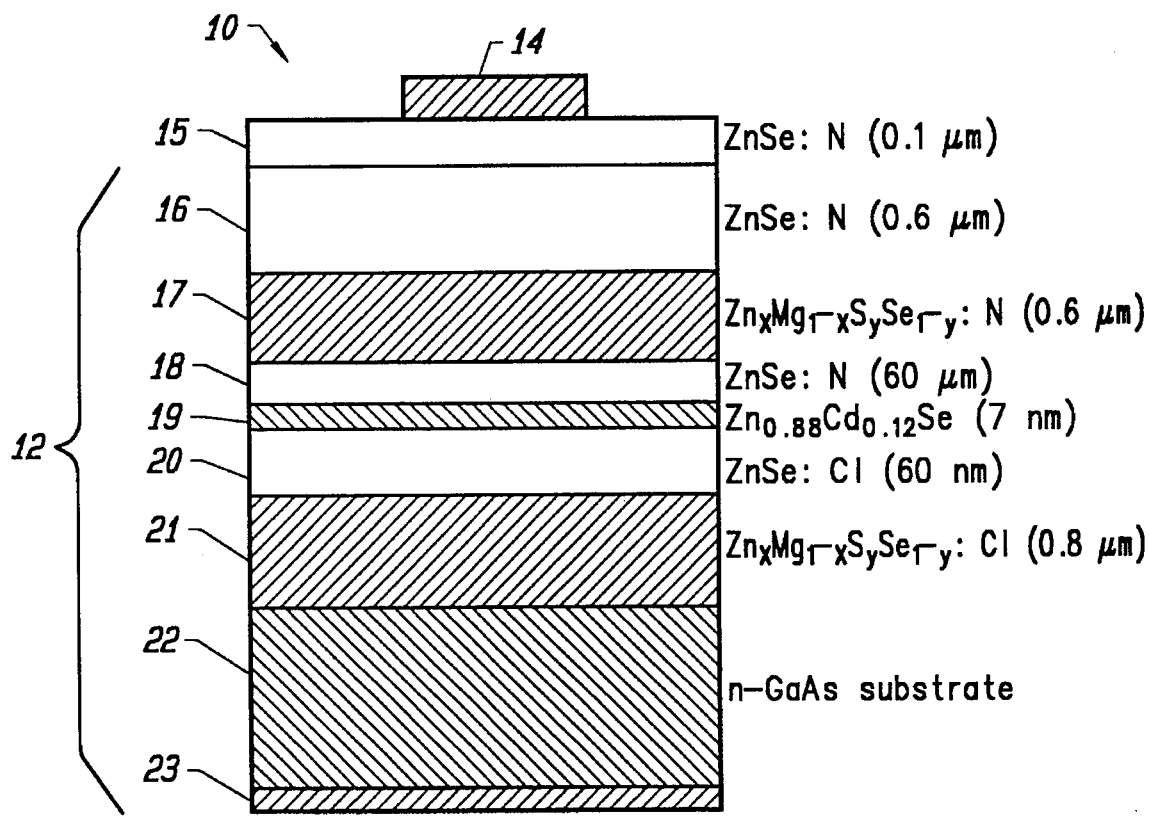
FIG. 1 is a cross section showing the multilayer structure of a semiconductor laser according to the invention.

The basic layer structure of a semiconductor laser, shown in FIG. 1, is a substrate (22), a cladding layer (21), an active layer (19), a second cladding layer (17), and a cap layer (15). It is also possible to alter the layer structure by inserting, for example, a buffer layer between the substrate and the cladding layer.

When the initial adsorption layer is a buffer layer and the last adsorption layer, i.e. the layer that adjoins the electrode is a cap layer, the layers from the buffer layer to the layer immediately preceding the cap layer are epitaxially grown using solid-source MBE. The crystallinity of the structure, i.e. the cladding layer/active layer/cladding layer, must be maintained at the highest level because it strongly affects the characteristics of the resulting semiconductor laser. Because these layers are grown by solid-source MBE (for example, as shown in FIG. 1 by the numeric designator 12), the invention permits the fabrication of a semiconductor laser having excellent characteristics.

The pressure inside the chamber during the growth operations performed in accordance with the aforementioned MBE method is the same as that used by known MBE methods, and is preferably at a level corresponding to an ultrahigh vacuum. In addition, the heating temperature of each cell depends on the source material, such as gallium, arsenic, zinc, and selenium.

The last p-type adsorption layer, e.g. the cap layer, can be formed by gas-source MBE or MOVPE (as shown in FIG. 1 by the numeric designator 10). Specifically, crystals can be formed by injecting the desired element into the chamber in a gas-phase form. In the invention, such crystals can be grown using hydrides or alkylation products of said elements. Specific examples of such compounds include Group II compounds, such as DMZn (which means dimethyl zinc; hereafter dimethyl is referred to as "DM"), DEZn (which means diethyl zinc; hereafter diethyl is referred to as "DE"), DMCd, and DECd; as well as Group VI compounds, such as $H_2S$, $H_2Se$, DMS, DMSe, DESe, DES, $C_4H_4Se$, and $C_4H_4S$.

The cap layer is formed by gas-source MBE or MOVPE. This reduces the resistance of the Schottky barrier between the device cap layer and the electrode located on the side adjacent to said cap layer, thus reducing the threshold voltage and the operating voltage of the semiconductor laser as well. It is a commonly accepted belief that this phenomenon is attributed to the fact that the hydrogen atoms contained in the source used in gas-source MBE or MOVPE (and also in the carrier gas in the case of MOVPE) enter the crystals, forming deep acceptor layers in the crystal surface, ultimately lowering the Schottky barrier.

Figure 2:
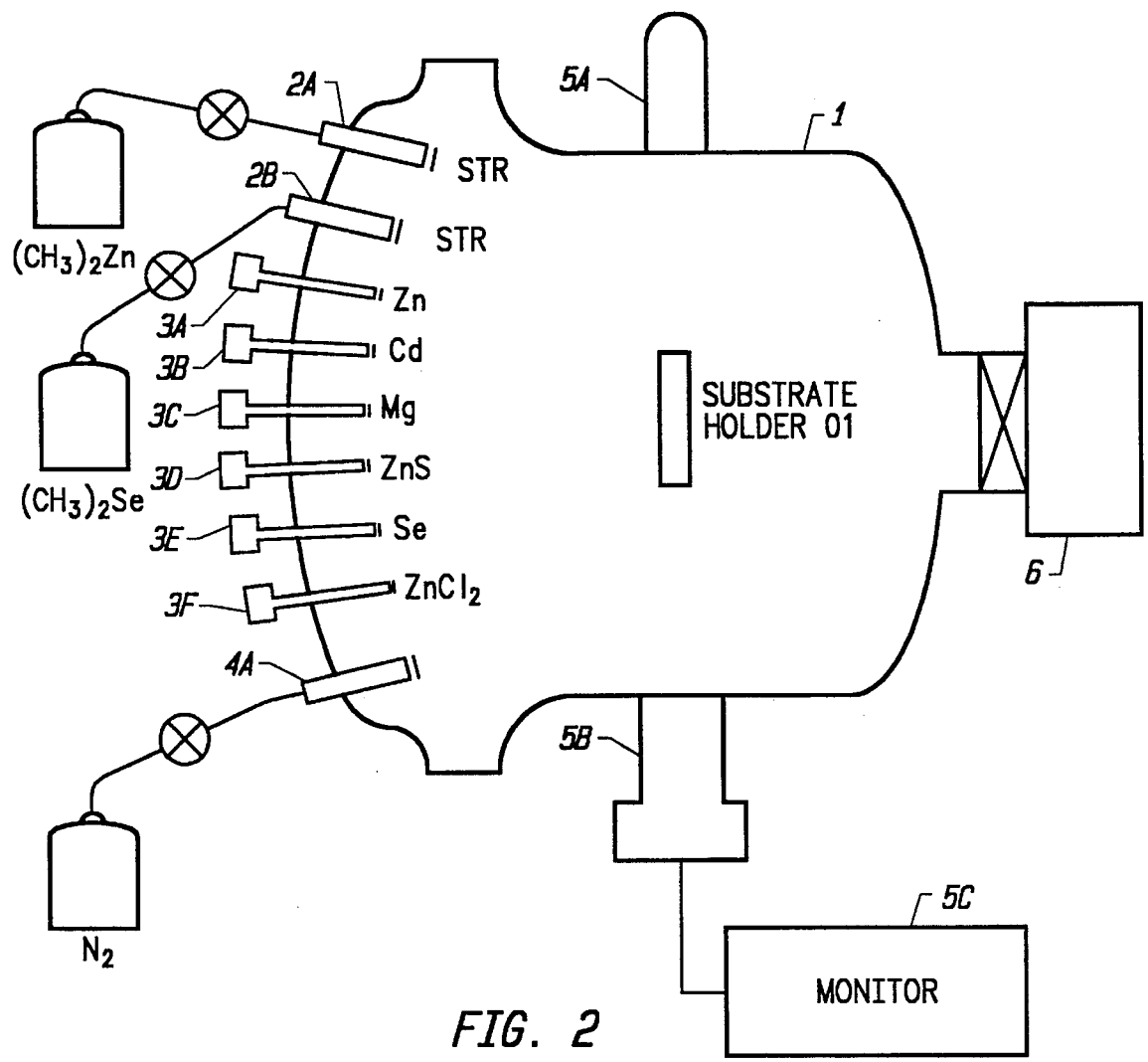
FIG. 2 is a schematic diagram showing an apparatus for fabricating the semiconductor laser shown in FIG. 1 according to the invention.

The preferred embodiment of the invention is now described for a ZnSe-based semiconductor laser with regard to FIGS. 1 and 2.

FIG. 2 is a diagram showing an example of an MBE apparatus of the type that may be used for manufacturing a semiconductor laser in accordance with the invention. In the figure, a substrate holder 01 which has an adjustable position and angle is placed by a manipulator (not shown) in the central section of a vacuum chamber 1. The chamber 1 is fitted with two gas emitting cells 2A and 2B that are capable of emitting $H_2S$ and $H_2Se$, and with cells 3A, 3B, 3C, 3D, 3E, and 3F that emit zinc, cadmium, magnesium, ZnS, selenium, and $ZnCl_2$, respectively. A shutter STR (only identified in FIG. 2 for cells 2A and 2B) is placed in front of each cell. An electron-cyclotron resonance (ECR) $N_2$ cell 4A is also provided.

The chamber 1 is equipped with a reflection high-energy electron diffraction ("RHEED") system comprising a RHEED gun 5A, a CCD camera 5B that records the diffraction patterns formed by the electron beams emitted by said gun 5A, and a monitoring device 5C. A cryopump, turbopump, or other pump 6 is used to obtain an ultrahigh vacuum in the chamber.

The following is a description of the process by which a semiconductor laser having a ZnSe-based quantum-well structure, as shown in FIG. 1, is manufactured using the apparatus described above:

(1) Solid-source MBE is used to form the device layers from the initial adsorption layer to the next-to-last adsorption layer (just before the cap layer 15 or a portion thereof, shown collectively in FIG. 1 by the numeric designator 12). An n-ZnMgSSe:Cl cladding layer 21 (in this example, 0.8 µm thick) is formed on an n-GaAs substrate 22 using a solid source. The substrate temperature is about 280° C. The carrier density (Nd-Na) is about $8 \times 10^{17}$. An n-ZnSe:Cl light guiding layer 20 (in this example, 60 nm thick) having the same carrier density as the cladding layer is subsequently formed, and a ZnCdSe active layer 19 (in this example, 7 nm thick) is formed. Additionally, a p-ZnSe:N light guiding layer 18 (in this example, 60 nm thick) having a carrier density (Na-Nd) of about $5 \times 10^{17}$ is formed. A p-ZnMgS-Se:N cladding layer 17 (in this example, 0.6 μm thick) having a carrier density (Na-Nd) of about $2 \times 10^{17}$, and a p-ZnSe:N layer 16 (in this example, 0.6 μm thick) having a carrier density (Na-Nd) of about $5 \times 10^{17}$ are then formed. For p-type nitrogen doping, active nitrogen formed by ECR is used.

(2) The last adsorption layer, i.e. the cap layer 15, is subsequently formed by gas-source MBE. Specifically, a p-ZnSe:N layer (in this example, 0.1 μm thick) having a carrier density of about $5 \times 10^{17}$ to $10^{18}$ (Na-Nd) is formed using $H_2Se$ instead of solid selenium in the intermediate product formed by solid-source MBE, as described in process step (1) above.

There is no particular need to control the pressure and temperature inside the chamber during the transfer to process step (2) from process step (1). It should be noted, however, that the oxidation of the intermediate product manufactured during process step (1) sometimes makes it impossible to satisfactorily perform gas source adsorption. Transfer of the partly processed substrate from process step (1) to process step (2) should therefore be performed quickly.

When the cap layer is grown using gas-source MBE under pronounced Group II rich conditions, i.e. about a 2:1 to about an 8:1 II–VI beam dose ratio, the p-type carrier density is easily raised, and a low contact resistance is obtained as a result. In the preferred embodiment of the invention, as the metal electrode, indium electrode 23 is used for the n-GaAs substrate 22, and a gold electrode 14 is used for the p-cap layer 15.

The gas sources used in the invention may contain hydrogen. As described above, it is believed that hydrogen acts as a deep acceptor and lowers the Schottky barrier. As a result, the threshold voltage of the semiconductor laser is lowered to between about 2.5 and 7 volts.

Active nitrogen formed by ECR was used in the embodiment of the invention described above, although it is also possible to use active nitrogen formed by an RF plasma. The substrate temperature can also be from about 230° to about 450° C. Laser operation is also possible with carrier densities in excess of $10^{17}$. Higher densities are advantageous in terms of operating voltage. Crystallinity is adversely affected, however, when the density is too high; the limit is generally considered to be about $5 \times 10^{19}$.

Layer thicknesses and structural material systems can all be modified depending on such characteristics as required generation wavelength and output. For example, the following structure is possible: n-GaAs substrate + n-ZnSSe cladding layer + n-ZnSe light-guide layer + ZnCdSe/ZnSe quantum-well active layer + p-ZnSe light-guide layer + p-ZnSSe cladding layer + pZnSSe cap layer. $HS_2$ may be used in addition to $H_2Se$ to grow the cap layer.

Any ohmic material may be used as the electrode, particularly on the side of the n-GaAs substrate. It is also effective to use platinum or palladium together with gold for the p-side electrode. It is also possible to obtain better crystals by first growing an n-GaAs buffer layer on the substrate.

Specific examples of the sources that can be used to grow ZnMgSSe/ZnCdSSe are shown in Tables 1 through 4 below.

TABLE 1

Solid-Source MBE (280° C./230° to 450° C.)

| Atom | Source |
|---|---|
| Group II | |
| Zn | Zn |
| Cd | Cd |
| Mg | Mg |
| Group VI | |
| S | ZnS |
| Se | Se |
| Te | Te |
| p-Dopant N | Active $N_2$ |
| n-Dopant Cl | $ZnCl_2$ |
| Ga | Ga |

TABLE 2

Gas-Source MBE (280° C./230° to 450° C.; Source is not an Organometal)

| Atom | Source |
|---|---|
| Group II | |
| Zn | Zn |
| Cd | Cd |
| Mg | Mg |
| Group VI | |
| S | $H_2S$ (cracked at 1110° C./1000° to 1200° C.) |
| Se | $H_2Se$ (cracked at 1110° C./800° to 1200° C.) |
| p-Dopant N | Active $N_2$ |
| n-Dopant Cl | $ZnCl_2$ |

TABLE 3

MOMBE (280° C./230° to 450° C.)

| Atom | Source |
|---|---|
| Group II | |
| Zn | Zn/DMZn (cracked at about 950° C.)/DEZn (cracked at about 1000° C.) |
| Cd | Cd |
| Mg | Mg |
| Group VI | |
| S | $H_2S$ (cracked at 1080° C.) |
| Se | DMSe (cracked at 850°/800° C.) |
| p-Dopant | |
| N | Active $N_2$/$NH_3$ |
| N | t-bu NH2 |
| N | t-bu $NH_3$ |
| n-Dopant Cl | $ZnCl_2$ |
| Ga | TEGa/TMGa |

In Table 3, TM and TE denote trimethyl and triethyl, respectively.

TABLE 4

MOVPE (MOCVD)(500° C./350° to 650° C.; Carrier Gas is Usually $H_2$)

| Atom | Source |
|---|---|
| Group II | |
| Zn | Zn/DMZn/DEZn |
| Cd | Cd |
| Mg | Mg |
| Group VI | |
| S | $H_2S$/DMS/DES/$C_4H_4S$ |
| Se | $H_2Se$/DMSe/DESe/$C_4H_4Se$ |
| N + Li | $Li_3N$/DMNLi |
| p-Dopant | |
| N | $NH_3$ |
| N | t-bu NH2 |
| N | t-bu NH3 |
| Li | $C_5H_5Li$/t-$C_4H_9Li$ |
| Al | TEAl |

TABLE 4-continued

| MOVPE (MOCVD)(500° C./350° to 650° C.; Carrier Gas is Usually $H_2$) | | |
|---|---|---|
| | Atom | Source |
| n-Dopant | I | $C_2H_5I/nC_4H_9I$ |
| | Br | $C_2H_5Br$ |
| | Cl | $I-C_8H_{17}Cl/HCl$ |
| | Ga | TEGa/TMGa |

In Table 4, TM and TE denote trimethyl and triethyl, respectively.

The invention offers several advantages over the prior art. For example, the value of the Schottky resistance between the cap layer and the electrode is reduced. Therefore:

(a) heat generation by the semiconductor laser can be reduced, measures aimed at absorbing heat become unnecessary or much less stringent, and the device can be made more compact; and (b) a semiconductor laser having a longer lifetime, higher luminous efficiency, and better reliability than in the past can be fabricated.

Although the invention is described herein with reference to the preferred embodiment, one skilled in the art will readily appreciate that other materials and applications may be substituted for those set forth herein without departing from the spirit and scope of the present invention. Accordingly, the invention should only be limited by the claims included below.

I claim:

1. A method for manufacturing a Group II–VI semiconductor laser, in which adsorption layers are successively formed as crystals on a substrate, said method comprising the steps of:

using solid-source Molecular-Beam Epitaxy (MBE) to form a plurality of adsorption layers containing crystal structure elements and doping impurities on an n-type substrate, from an initial adsorption layer to a next-to-last layer; and using either of gas-source MBE or Metal-Organic Vapor-Phase Epitaxy (MOVPE) to form a last p-type adsorption layer on the next-to-last layer.

2. The method of claim 1, wherein the step of forming said last p-type adsorption layer is performed under Group II rich conditions.

3. The method of claim 2, wherein the step of forming said last p-type adsorption layer is performed while maintaining a II–VI beam dose ratio at about 2:1 to about 8:1.

4. The method of claim 1, wherein the step of forming said last p-type adsorption layer is performed with a gas source that contains hydrogen.

* * * * *